United States Patent [19]
Yoshida et al.

[11] Patent Number: 4,738,729
[45] Date of Patent: Apr. 19, 1988

[54] AMORPHOUS SILICON SEMICONDUCTOR SOLAR CELL

[76] Inventors: Toshihiko Yoshida, 1902-5, Oaza Kamekubo, Ohi-machi, Iruma-gun, Saitama-ken; Mitsuo Matsumura, 2137, Oaza Yaharashinden, Kasukabe-shi, Saitama-ken; Hideo Yamamoto, 741-3, Oaza Nishitsurugaoka, Ohi-machi, Iruma-gun, Saitama-ken; Kunio Asai, 1902-5, Oaza Kamekubo, Ohi-machi, Iruma-gun, Saitama-ken; Osamu Nakamura, 26-2, Kamiogi 4-chome, Suginami-ku, Tokyo; Yoshinobu Okayasu, 1902-5, Oaza Kamekubo, Ohi-machi, Iruma-gun, Saitama-ken, all of Japan

[21] Appl. No.: 6,869

[22] Filed: Jan. 27, 1987

Related U.S. Application Data

[63] Continuation of Ser. No. 662,740, Oct. 19, 1984, abandoned.

[51] Int. Cl.$^4$ ............................................. H01L 31/06
[52] U.S. Cl. ....................................... 136/258; 357/30
[58] Field of Search ................. 136/258 AM; 427/39, 427/74, 86; 357/30, 59 C, 30 J, 30 K; 148/33, 33.4, 33.5, 33.6

[56] References Cited

U.S. PATENT DOCUMENTS

| 4,385,199 | 5/1983 | Hamakawa et al. | 136/258 AM |
| 4,441,113 | 4/1984 | Madan | 357/2 |
| 4,460,670 | 7/1984 | Ogawa et al. | 430/57 |
| 4,471,042 | 9/1984 | Komatsu et al. | 430/64 |
| 4,476,346 | 10/1984 | Tawada et al. | 136/249 TJ |
| 4,499,331 | 2/1985 | Hamakawa et al. | 136/258 AM |

Primary Examiner—Aaron Weisstuch

[57] ABSTRACT

This invention disclose an amorphous silicon semiconductor film containing at least hydrogen, carbon and oxygen as impurities and the method to produce it. The film is characterized in that the total quantity of carbon and oxygen in said film is at least 0.1 atom %. Since the film has small light absorption coefficient and its optical refractive index is controllable, an excellent window material for solar cell can be provided. Since adherence of the film with a metal electrode as well as with a transparent electrode is sufficient, good reproducibility in making solar cells using the film of this invention as a window material was realized.

3 Claims, 3 Drawing Sheets

AMORPHOUS SILICON SEMICONDUCTOR SOLAR CELL

This is a continuation of application Ser. No. 662,740, filed 10-19-84, and now abandoned.

BACKGROUND OF THE INVENTION

1. Field of the Invention

This invention relates to a novel amorphous silicon semiconductor film. More particularly, the invention relates to an amorphous silicon semiconductor film which has a low light absorptivity and is suitable for use as a window material, and a process of producing such a film.

2. Description of the Prior Art

Amorphous solar cells of a p-i-n structure have drawn the attention of researchers recently because of their extremely low production cost, compared with monocrystalline solar cells, and the development of such amorphous solar cells is being promoted eagerly, because they are now considered to be the most promising type of solar cells.

It is generally known that when an amorphous silicon semiconductor of a p-i-n structure is adapted to function as a solar cell, the carriers generated by the absorption of light by amorphous silicon (these carriers are hereinafter called light-generated carriers) in the p-layer or the n-layer have a short life, and therefore light-generated carriers which can provide a photocurrent are generated essentially in the i-layer. However, in a p-i-n type of solar cell, since the i-layer is sandwiched between the p-layer and the n-layer, light enters the i-layer after passing through the p-layer or n-layer, so that it is desirable that the p-layer or the n-layer be made of a material with a low light absorptivity. The light absorption coefficient of conventional n-type or p-type amorphous silicon is substantially equal to or greater than that of the amorphous silicon of the i-layer, so that light absorption losses in the n layer or the p-layer are one of the causes of lowering of the photoelectric conversion efficiency.

As a p-i-n type amorphous solar cell has a structure consisting of either (glass/transparent electrode/p-i-n or n-i-p/metal), or (transparent electrode/p-i-n or n-i-p/metal), light enters through the transparent electrode. In this structure, light losses due to the reflection of light by the solar cell are also a cause of reduced photoelectric conversion efficiency. In this case, in order to minimize the reflection of light at the interface between the transparent electrode and the p-layer or the n-layer, it is desirable to control the refractive index of the p-layer or the n-layer. In practice, however, the refractive index of the conventional p-layer or n-layer, for instance, is in the range of 3.4 to 3.6 for light of 1500 nm, the same as that of the amorphous silicon of the i-layer, which is substantially different from the refractive index of the transparent electrode, approximately 2.0, and because of this difference in refractive indices in the cell structure, reflection losses have been considered inevitable.

Another disadvantage of conventional p-i-n type amorphous silicon semiconductors is that their production yield is low because of the unsatisfactory adhesion of a p-i-n or n-i-p assembly to a stainless steel substrate and transparent electrode.

Amorphous silicon containing carbon and hydrogen as impurities (a-Si:C:H) has been proposed as a material which is free of these drawbacks, (Japan Patent Publication OPI-No. 126,175/82, etc.). This amorphous silicon (a-Si:C:H) can control light absorption and, in this respect, can help to improve the photoelectric conversion efficiency of a cell, but it is still unsatisfactory from the point of view of improvements in light reflection and adhesion to a stainless steel substrate and transparent electrode.

As a result of extensive studies into overcoming these drawbacks of the prior art, the present inventors have found that a thin film of a p-type or n-type amorphous silicon semiconductor obtained from the plasma decomposion of a mixture consisting of at least one gas selected from silane or its derivatives and fluoro silane or its derivatives, and at least one one gas selected from CO, $CO_2$, oxygen-containing organic compounds, and mixtures of hydrocarbons and oxygen, contains at least hydrogen, carbon, and oxygen as impurities (this amorphous silicon semiconductor is hereinafter referred to as a-Si:H:C:O), and that it has a small light absorption coeficient. Moreover the refractive index of thus-obtained a-Si:H:C:O can be controlled, so that it is ideal for use as a window material for photoelectric converter elements with p-i-n junctions. The present invention was achieved on the basis of this novel finding.

SUMMARY OF THE INVENTION

Accordingly, it is a first object of this invention to provide a p-type or n-type amorphous silicon semiconductor which has a small light absorption coefficient, and a process of producing it.

It is a second object of this invention to provide a p-type or n-type amorphous silicon semiconductor which enables controlling the refractive index thereof to minimize reflection loss, and a process of producing such a semiconductor.

It is a third object of this invention to provide a window material for p-i-n type semiconductors which has an improved adhesion to both a stainless steel substrate and a transparent electrode, and a process of producing such a window material.

It is a fourth object of this invention to provide a thin film of an amorphous silicon semiconductor characterized by containing at least hydrogen, carbon, and oxygen as impurities, and further characterized in that the total quantity of oxygen and carbon within the film is at least 0.1 atom %, and a process of producing such an amorphous silicon semiconductor film.

When the amorphous silicon of the present invention is used as a window material for solar cells, it is possible to efficiently produce inexpensive solar cells which have a good photoelectric conversion efficiency. The present invention is therefore of great significance.

DESCRIPTION OF THE PREFERRED EMBODIMENTS

Figure 1:
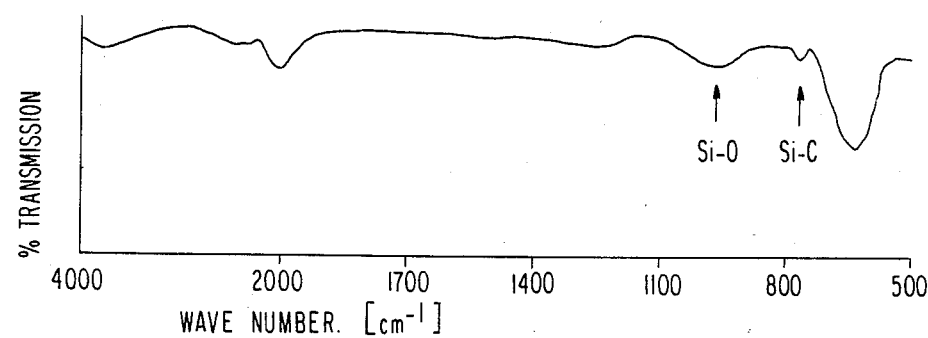
FIG. 1 is an infrared absorption spectrum of a p-type a-Si:H:C:O film obtained according to this invention.

The amorphous silicon semiconductor film of the present invention can be produced by introducing specific gases into a vacuum reactor, adjusting the internal pressure of the reactor to a predetermined level, and then subjecting the gas mixture to ordinary plasma decomposition or heating the gas mixture to a high temperature. The term "plasma decomposition" used in this specification refers to a technique of forming a silicon film on a substrate in a plasma atmosphere. This plasma atmosphere can easily be realized by various known discharge methods such as high-frequency discharge, low-frequency discharge, DC discharge, etc.

To form a silicon film containing at least hydrogen, carbon and oxygen as impurities in a plasma atmosphere, it is necessary that at least silicon atoms, hydrogen atoms, carbon atoms, and oxygen atoms, or their ions, are able to exist in a plasma.

As is well known, when producing a silicon film containing hydrogen as an impurity by plasma decomposition, a plasma atmosphere is created by discharging a feed gas of a hydrogen-containing silicon compound such as silane or its derivatives. In this case hydrogen may be used as a carrier; and if adding oxygen to the feed gas, it is possible to produce a silicon film containing oxygen and hydrogen as impurities. However, when adding oxygen, the use of hydrogen as a carrier gas results in the danger of explosion, but if a silicon film is formed by using a gas mixture of this combination outside the explosion limit, it is difficult to introduce the required quantities of hydrogen and oxygen into the thin film (see, for instance, Japan Patent Publication-OPI No. 77020/82), and in such a case discharge conditions must be strictly selected.

The physical properties of an amorphous silicon semiconductor film depend to a large extent on the types and quantities of impurities contained in the film, and the physical properties, especially its coefficient of absorption and adhesiveness to a metal substrate and/or transparent electrode, are affected to a large extent by the quantities of oxygen and carbon contained as impurities in the film. As the presence of carbon and oxygen in the amorphous silicon semiconductor of this invention partly provides silicon carbide (band gap: ≈6.0 eV) and silicon oxide (band gap: 9.0 eV) which have wide band gaps, the band gap of the a-Si is widened to reduce its absorption coefficient.

As for its refractive index, because of the localized presence of silicon carbide (refractive index: 2.48) and silicon oxide (refractive index: 1.46) structures, it is possible to control the refractive index of the resultant a-Si semiconductor.

In addition, carbon and oxygen, which can enter the four-coordinated Si network, act to relieve structural stresses within an amorphous silicon semiconductor film, resulting in an improved adhesion to both a metal substrate and transparent electrode.

On the other hand, hydrogen contained as an impurity in the amorphous silicon semiconductor film of the present invention acts to eliminate dangling bonds of silicon atoms produced during the formation of the amorphous silicon film, reducing the density of the localized states in the silicon film. This is of great significance when controlling electric resistance of the semiconductor element according to the present invention.

Thus, by also introducing a p-type or n-type dopant into the amorphous silicon semiconductor, it is possible to produce a p-type or n-type amorphous silicon semiconductor film which has an improved absorption coefficient as well as an improved adhesion to a metal substrate or transparent electrode.

A characteristic feature of the amorphous silicon of the present invention, which has an improved absorption coefficient and adhesion to a metal substrate or transparent electrode, is that the total quantity of carbon and oxygen within the film as at least 0.1 atom % (the unit atom % in this case is given by $100 \times (C+O)/(Si+C+O)$, no matter what other impurities are present. This feature can not be easily realized by known methods, but can only be achieved by using the following specific film formation conditions:

Power density: 0.01–1 W/cm$^2$
Gas flow rate: 1–100 SCCM
Substrate temperature: 200°–400° C.
Pressure during discharge: 0.05–2 Torr
(Oxygen source/Si source) ratio: 0.001–1.5 (by volume)

Considering the film-formation speed, etc., the following conditions are more preferable:

Power density: 0.01–0.5 w/cm$^2$
Gas flow rate: 5–50 SCCM
Substrate temperature: 200°–350° C.
Pressure during discharge: 0.05–1 Torr
(Oxygen source/Si source) ratio: 0.05–1.0 (by volume)

The oxygen source is at least one or a mixture of two or more cases selected from CO, CO$_2$, oxygen-containing organic compounds, and mixtures of hydrocarbons and oxygen. Some oxygen-containing organic compounds are alcohols, ethers, carboxylic acids, keto acids, etc. Mixtures of hydrocarbons and oxygen may be, for example, (CH$_4$+O$_2$) or (C$_2$H$_6$+O$_2$). Ozone (O$_3$) can also be used as an oxygen source. The Si source used in this invention is at least one of a mixture of two or more gases selected from silanes represented by the formula (Si)nH$_{2n+2}$, derivatives thereof, such as (si)nXmH$_{2n+2-m}$ (wherein X is a halogen atom). The pressure during discharge means the total pressure of gases in the film formation chamber during the period of the discharge. Therefore, when using a rate gas as carrier gas, the pressure of this rare gas is also included in the total pressure.

To endow p-type or n-type character to the silicon film of this invention, it is necessary to add a dopant gas in addition to these described above. Elements in Group III of the Periodic Table, or their compounds, can be used as a p-type dopant gas and among these a hydride, especially diborane (B2H6), is preferred. Elements in Group V of the Periodic Table, or their compounds, preferably hydrides, especially phosphine (PH3) or arsine (AsH3), can be used as an n-type dopant gas.

Aluminum, antimony, stainless steel and the like can be cited as typical examples of the material of the metal electrode used as a substrate in this invention.

As can be appreciated from the above description, the present invention can provide a semiconductor which has a small light absorption coefficient and an optimal refractive index, and this semiconductor is extremely useful as a material on the light-incidence side of a p-i-n type of amorphous solar cell.

EXAMPLES

The following examples are provided to illustrate present invention, but are not to be construed as limiting the present invention in any way.

EXAMPLE 1

The p-type a-Si:H:C:O film was prepared according to the present invention. In this case, the film was produced from mixed gases having ratios $CO/SiH_4=0.7$, $B_2H_6/SiH_4=0.01$ and $CO/H_2=2.33$ under the following conditions of plasma discharge decomposition:

power density = 0.24 W/cm$^2$,
pressure during discharge = 0.1 Torr;
substrate temperature = 250° C.;
gas flow rate = 10 SCCM (standard cubic centimeters).

FIG. 1 shows infrared spectroscopic data on a thin film obtained under the above film formation conditions. Marked absorption is seen at wave numbers close to 1,000 cm$^{-1}$ and 780 cm$^{-1}$, which indicates the presence of Si-O bonds and Si-C bonds. This confirmed that this film is an amorphous silicon semiconductor film containing carbon and oxygen. By calculation from these absorption intensities, the total quantity of oxygen and carbon within the film was estimated to be about 3%.

Figure 2:
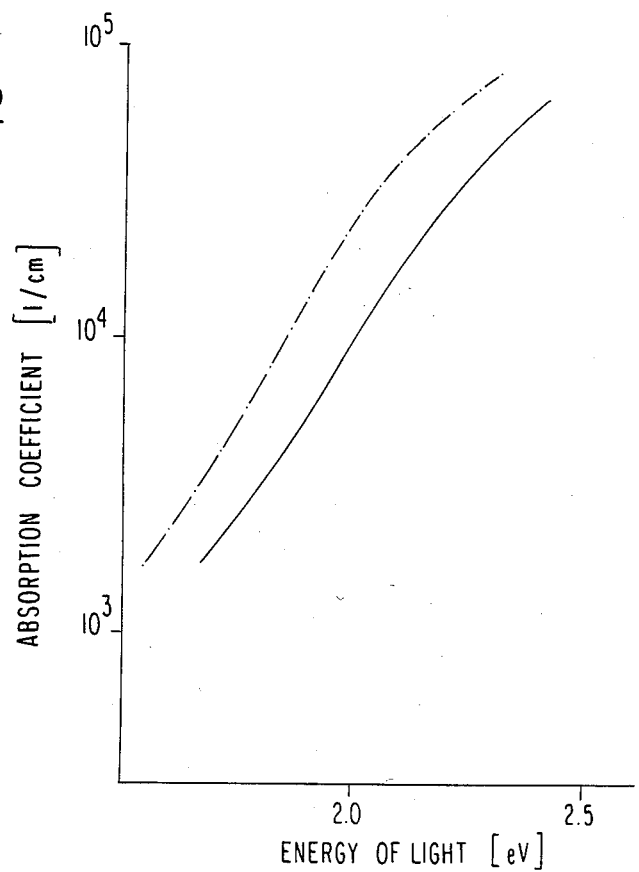
FIG. 2 is a graph of a comparison of the light absorption coefficient of a conventional p-type Si film with that of a p-type a-Si:H:C:O film obtained according to the present invention. In the graph, the broken line represents the conventional a-Si film and the solid line represents the film of this invention.

FIG. 2 shows the dependency on wavelength of the light absorption coefficient of obtained p-type a-Si:H:C:O film, compared with a conventional p-type amorphous silicon semiconductor film.

It can be seen that the p-type a-Si:H:C:O film obtained in the present invention has a smaller light absorption coefficient than the conventional amorphous silicon semiconductor film, which corroborates the effect of this invention.

EXAMPLE 2

CO/SiH4 radio dependency of the refractive index of the amorphous silicon semiconductor of the present invention was examined. In this case the amorphous silicon film was produced from mixed gases having ratios of $SiH_4/H_2=1/9$ and $B_2H_6/SiH_4=0.01$ under the following fixed film formation conditions:

power density = 0.24 W/cm$^2$;
pressure during discharge = 0.1 Torr;
substrate temperature = 250° C.;
gas flow rate = 10 SCCM.

Figure 3:
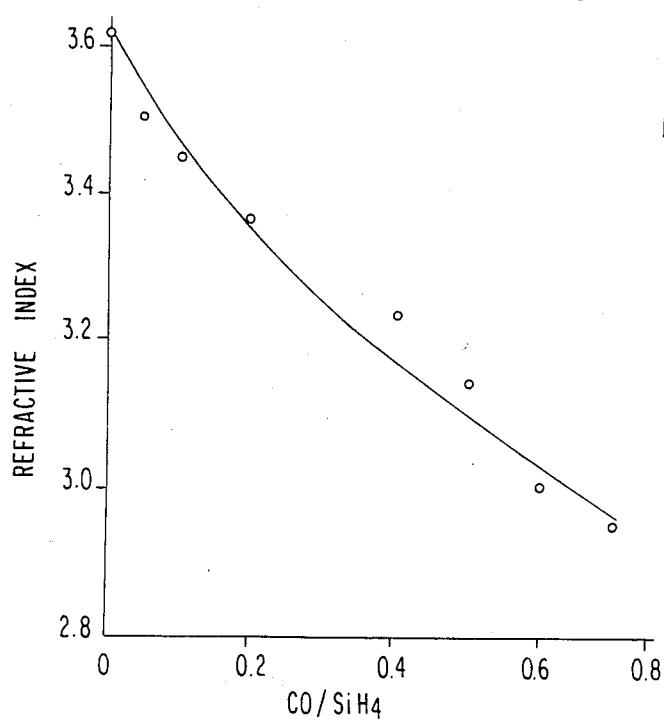
FIG. 3 shows the $CO/SiH_4$ ratio (when an a-Si:H:C:O film is formed) dependency of the refractive index, at a wavelength of 1,500 nm, of an a-Si:H:C:O film of the present invention.

The results are shown in FIG. 3 and this figure verfies that the refractive index of an amorphous silicon semiconductor film of this invention can be controlled by adjusting the CO/SiH4 ratio.

Figure 4:
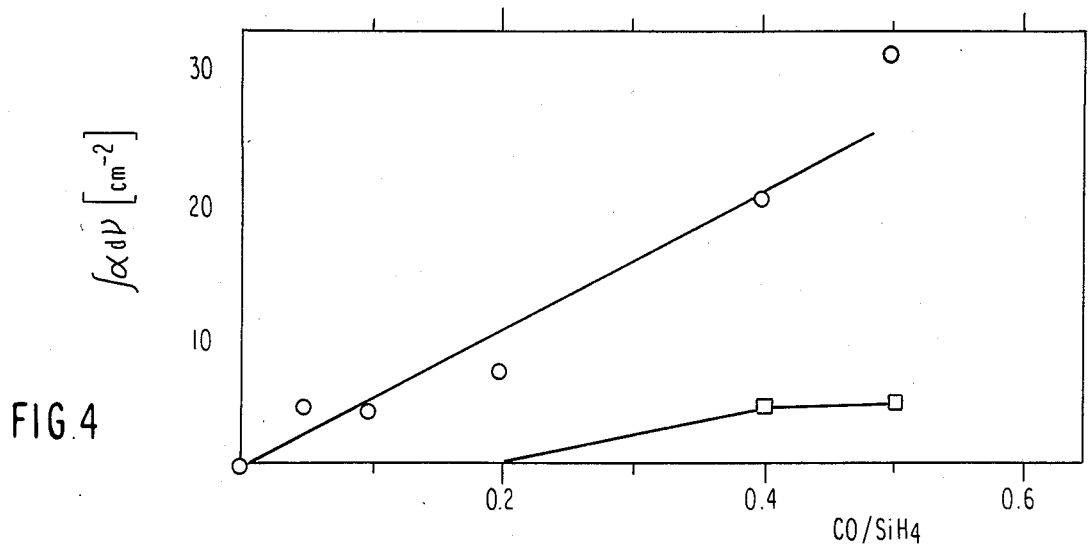
FIG. 4 shows the CO/SiH$_4$ ratio dependency of $\int \alpha d\alpha$ of Si-O and Si-C, wherein $\int \alpha d\alpha$ means integral value of absorption coefficient in the infrared reagion vs. cm$^{-1}$.
Figure 5:
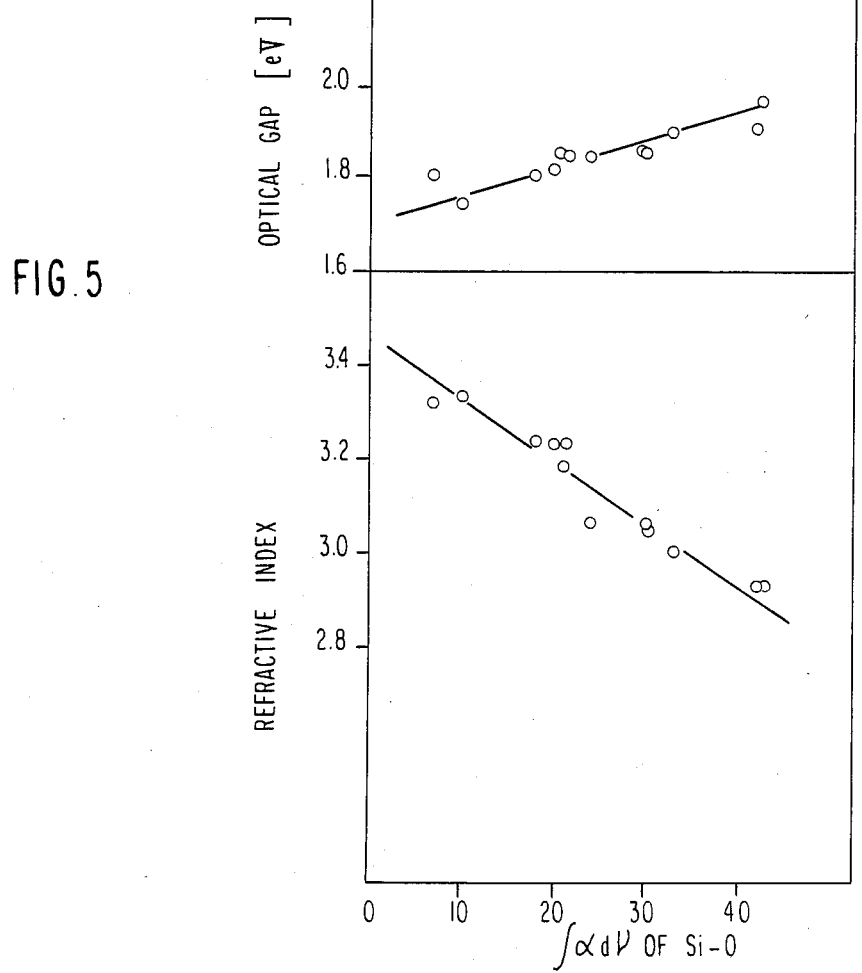
FIG. 5 shows that the band gap of the film obtained in this invention increases with increasing value of $\int \alpha d\alpha$ of Si-O, but the refractive index decreases.

FIG. 4 shows the CO/SiH4 ratio dependency of $\int \alpha d\alpha$ of Si-O and Si-C, wherein $\int \alpha d\alpha$ means integral value of absorption coefficient in infrared region vs. cm$^{-1}$ and the quantities of Si-O and Si-C can be estimated from its value. This figure indicates that the amount of Si-C contained in the above obtained amorphous silicon film is very small. Moreover, as shown in FIG. 5, the band gap of the film increases with increasing the $\int \alpha d\alpha$ of Si-O, but however the refractive index decreases. These facts indicate that the effect of present invention occurs mainly due to the existence of Si-O.

EXAMPLE 4

Figure 6:
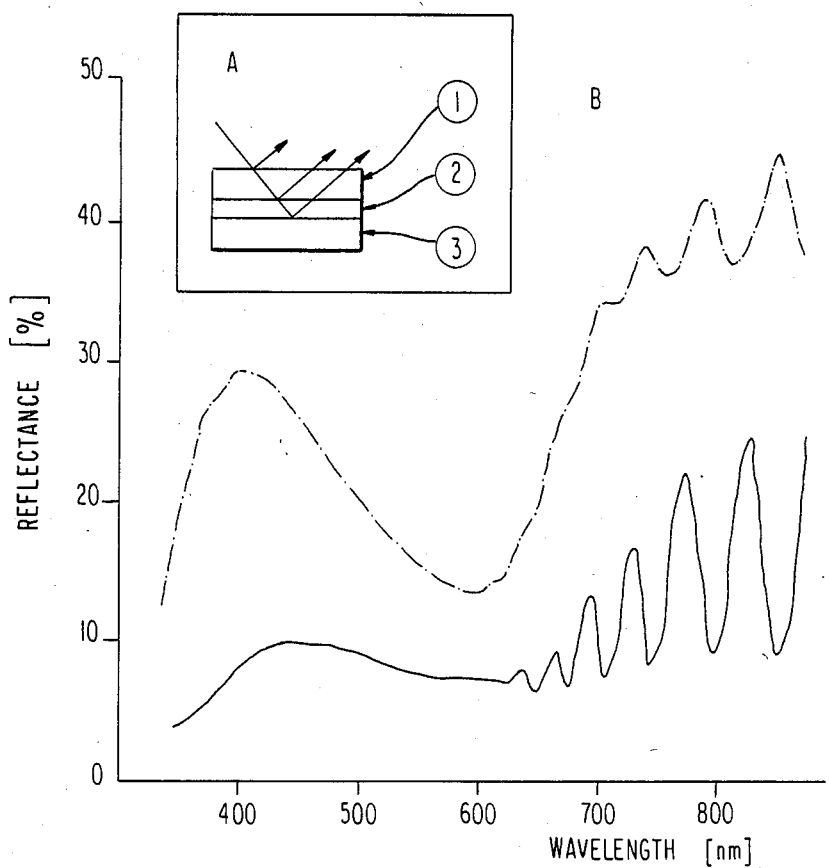
FIG. 6(A) shows the paths of reflected light observed in an a-Si semiconductor element. In the drawing, reference numeral 1 denotes glass, 2 a transparent electrode, and 3 an amorphous silicon layer.
FIG. 6(B) is a graph of a comparison of the reflectivities of an amorphous silicon layer obtained according to this invention and an amorphous silicon layer obtained according to a conventional method. In the graph, the broken line represents the conventional layer and the solid line the layer according to the present invention.

FIG. 6(B) shows the results of a comparison of the light reflectivities of a sample with a glass/transparent electrode/p-type a-Si:H:C:O structure using an amorphous silicon semiconductor film according to this invention, and a conventional sample with a glass/transparent electrode/p-type a-Si:H structure. From these results, it was determined that the reflection of light at the interface between the amorphous silicon semiconductor film of this invention and the transparent electrode was less than that in the conventional product. It was also ascertained that the reflection of light is also reduced in a p-i-n type of solar cell using the amorphous silicon semiconductor film of this invention as a window material, so that the photoelectric conversion efficiency of the cell as a whole was improved.

EXAMPLE 5

Figure 7:
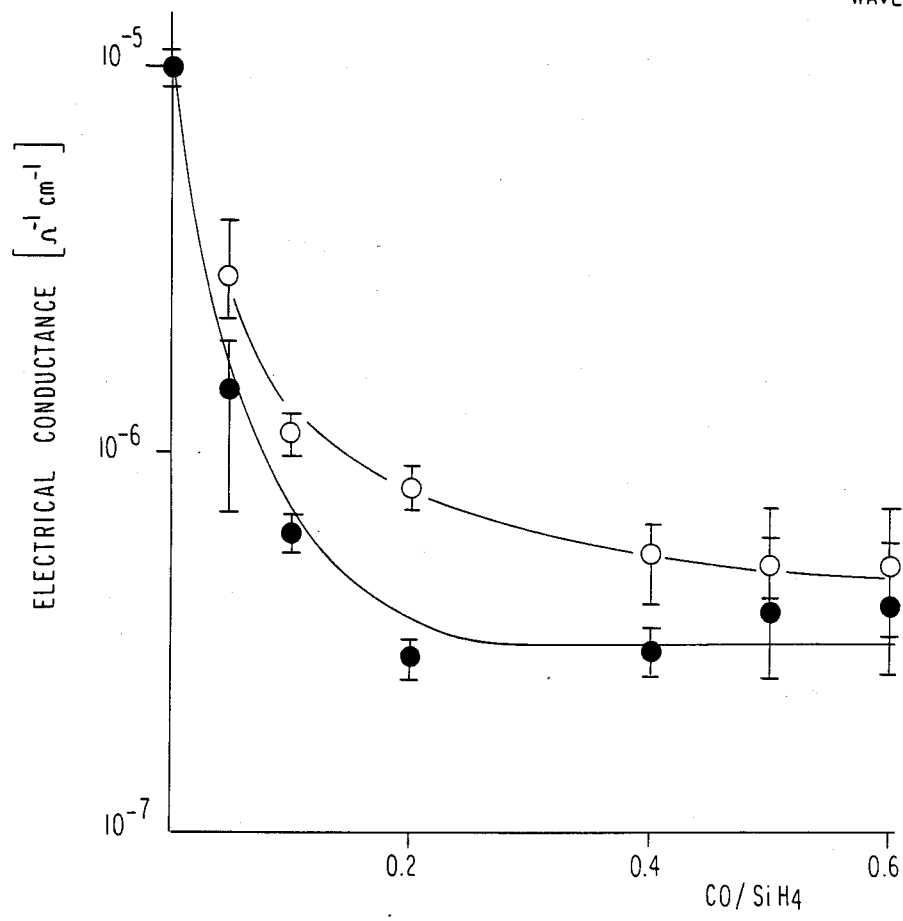
FIG. 7 is a graph showing the CO/SiH$_4$ ratio dependency of the electrical conductance of the produced amorphous silicon film.

FIG. 7 shows the CO/SiH4 ratio dependency of electrical conductance of amorphous silicon semiconductor film obtained in this invention. The film formation conditions for each film were as follows:

$B_2H_6/SiH_4=1\%$,
power density = 0.24 W/cm$^2$,
pressure in chamber during discharge = 0.1 Torr;
substrate temperature = 250° C.,
gas flow rate = 10 SCCM.

Each sample was verified as being p-type by a measurement of its electromotive force. Since each of the samples showed an electrical conductance of at least $10^{-7} \Omega^{-1} cm^{-1}$, its suitability as a p-layer for a solar cell was verified.

EXAMPLE 6

When films were formed on a stainless steel or transparent electrode substrate under the following conventional film formation conditions:

$SiH_4/H_2=1$, $B_2H_6/SiH_4=0.01$;
power density = 0.24 W/cm$^2$;
pressure in chamber during discharge = 100 m Torr;
substrate temperature = 250° C.;
gas flow rate = 10 SCCM;

the films were not always formed with good reproducibility, and were often cloudy. This clouding is due to non-uniform adhesion of the film to the substrate, and it may cause short-circuiting during the manufacture of solar cells.

When films were formed under the same conditions, but with CO added to give a CO/SiH4 ratio of 0.05, the formed films did not become cloudy, and could be produced with good reproducibility. These facts verify that the addition of carbon and oxygen as impurities into amorphous silicon film improves the adherence of the film to the substrate.

What is claimed is:

1. A P-I-N type amorphous semiconductor solar cell including an amorphous silicon semiconductor film, wherein said amorphous silicon semiconductor film comprises at least hydrogen, carbon and oxygen as impurities and has a refractive index of 2.0–3.4, wherein the total quantity of carbon and oxygen in the amorphous silicon semiconductor film is at least 0.1 atom%, wherein said film comprises a A or an n layer thereof and said film comprises a window layer of said solar cell.

2. The amorphous silicon semiconductor solar cell of claim 1, wherein said window layer is an n-type semiconductor comprising at least one dopant element selected from the elements in Group V of the Periodic Table.

3. The amorphous silicon semiconductor solar cell of claim 1, wherein said window layer is a p-type semiconductor comprising at least one dopant element selected from the elements in Group III of the Periodic Table.

* * * * *